United States Patent [19]

Fan et al.

[11] Patent Number: 4,744,615

[45] Date of Patent: May 17, 1988

[54] LASER BEAM HOMOGENIZER

[75] Inventors: Bunsen Fan, Peekskill; Raymond E. Tibbetts, Mahopac; Janusz S. Wilczynski; David F. Witman, both of Ossining, all of N.Y.

[73] Assignee: International Business Machines Corporation, Armonk, N.Y.

[21] Appl. No.: 823,554

[22] Filed: Jan. 29, 1986

[51] Int. Cl.$^4$ .......................... G02B 6/00; H01S 3/10; F21V 7/04
[52] U.S. Cl. .............................. 350/96.10; 350/96.18; 350/96.28; 372/9; 372/57; 362/259; 362/32; 219/121 LA; 219/121 LT
[58] Field of Search ............... 350/96.10, 96.11, 96.12, 350/96.25, 96.28, 96.30, 523, 527, 445, 355, 356; 372/6, 7, 9, 12, 29, 57, 33; 362/32, 259; 352/203; 219/121 LA, 121 LT

[56] References Cited

U.S. PATENT DOCUMENTS

| | | | |
|---|---|---|---|
| 3,536,558 | 10/1970 | Lipkins | 350/96.28 X |
| 3,693,515 | 9/1972 | Baker | 350/96.28 X |
| 3,913,872 | 10/1975 | Weber | 350/96.28 X |
| 3,923,379 | 12/1975 | Kumada | 350/406 |
| 3,941,973 | 3/1976 | Luck, Jr. et al. | 350/96.28 X |
| 4,011,403 | 3/1977 | Epstein et al. | 350/96.10 X |
| 4,427,283 | 1/1984 | Gasper | 350/96.28 X |
| 4,547,044 | 10/1985 | Jain et al. | 350/445 |
| 4,576,435 | 3/1986 | Nishioka | 350/96.28 X |
| 4,641,912 | 2/1987 | Goldenberg | 350/96.10 |

OTHER PUBLICATIONS

"Design Ideas", by K. Iwasaki et al, Laser & Applications, Apr. 1983, p. 76.
"A Light Pipe for Flux Collection", by H. D. Wolpert, Lasers & Applications, Apr. 1983, pp. 73-74.

*Primary Examiner*—William L. Sikes
*Assistant Examiner*—Brian M. Healy
*Attorney, Agent, or Firm*—Ronald L. Drumheller; John J. Goodwin

[57] ABSTRACT

A coherent laser beam having a possibly non-uniform spatial intensity distribution is transformed into an incoherent light beam having a substantially uniform spatial intensity distribution by homogenizing the laser beam with a light tunnel (a transparent light passageway having flat internally reflective side surfaces). It has been determined that when the cross-section of the tunnel is a polygon (as preferred) and the sides of the tunnel are all parallel to the axis of the tunnel (as preferred), the laser light at the exit of the light tunnel (or alternatively at any image plane with respect thereto) will have a substantially uniform intensity distribution and will be incoherent only when the aspect ratio of the tunnel (length divided by width) equals or exceeds the contangent of the input beam divergence angle $\theta$ and when $$W_{min} = L_{coh}(R + (1+R^2)^{\frac{1}{2}}) > 2RL_{coh},$$

where $W_{min}$ is the minimum required width for the light tunnel, $L_{coh}$ is the effective coherence length of the laser light being homogenized and R is the chosen aspect ratio for the light tunnel.

8 Claims, 10 Drawing Sheets

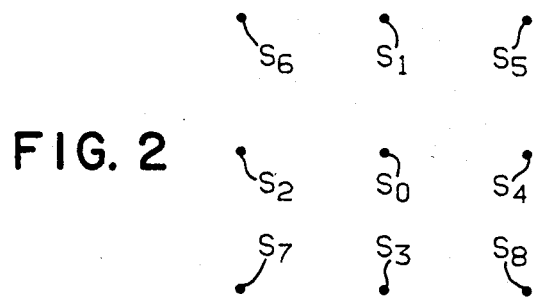
FIG. 2
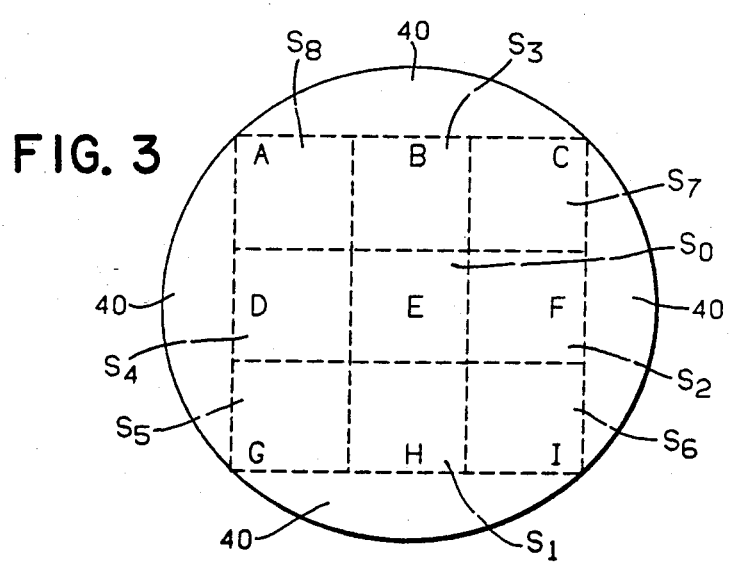
FIG. 3
FIG. 4

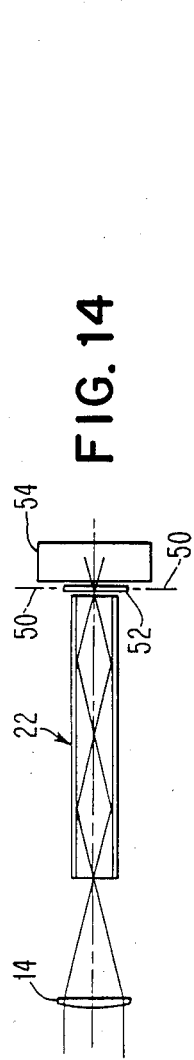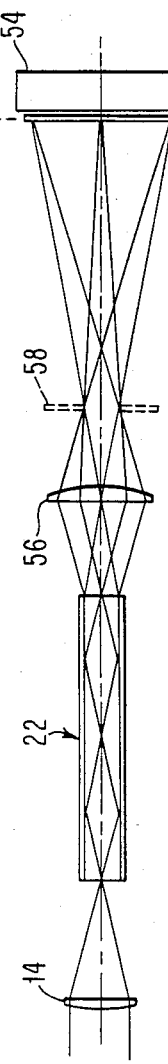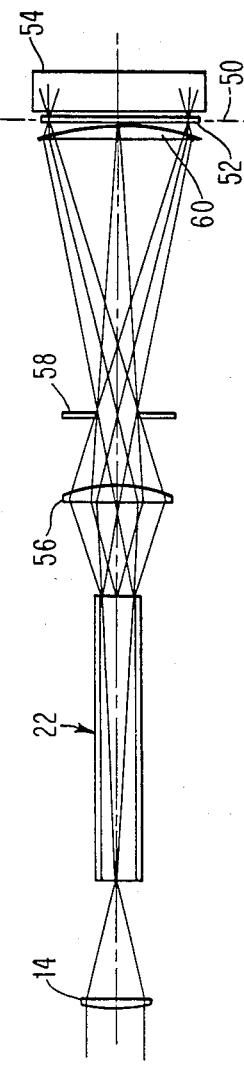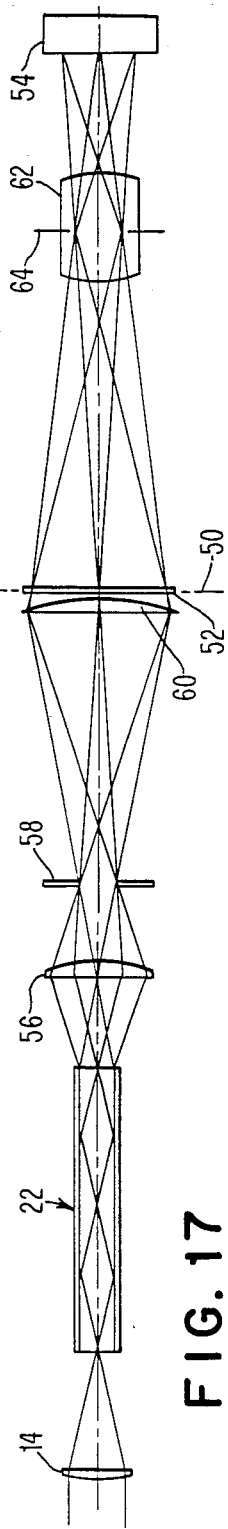

LASER BEAM HOMOGENIZER

DESCRIPTION

Technical Field

This invention relates to illumination systems and more particularly to laser illumination systems. It also relates to apparatus and methods for making laser illumination more uniform and/or incoherent.

BACKGROUND ART

In the fabrication of microcircuits, a light sensitive resist layer is typically exposed to a pattern of light formed by illuminating a patterned mask. The light sensitive layer is then developed to form a relief pattern corresponding to the mask pattern. The minimum size of the mask features which can be faithfully reproduced in the developed resist layer is directly related to the wavelength of the light used to illuminate the mask. Since it is desirable to be able to reproduce features as small as possible, the wavelength of the illumination being used has been constantly decreasing from the visible light region through the near ultraviolet range and into the deep ultraviolet range.

In order for an illumination system to be practical for such purposes, however, the spatial pattern of illumination intensity it provides at the mask plane must be substantially uniform. This uniform intensity also should be as high as possible so that an exposure can be made in as short a time as possible. In the deep ultraviolet range these two goals are not easily met simultaneously. The most intense deep ultraviolet light sources are excimer lasers, but the spatial light intensity from such sources is not sufficiently uniform. Furthermore, conventional methods for making the light from a nonuniform source more uniform tend to fail when applied to coherent laser light because coherent light tends to produce interference patterns of spatially varying light intensity.

One prior art approach to this problem has been to effectively move the light source during the exposure so as to smear or average the intensity pattern of the illumination. Another prior art technique for making illumination more uniform is to use an array of optical fibers to mix the spatial intensity pattern. However, these techniques are expensive to implement; much of the available light is lost during the mixing process; and the resulting illumination uniformity is not as good as is desired.

SUMMARY OF THE INVENTION

It is an object of this invention to make laser light more uniform in spatial intensity.

Another object is to make laser light incoherent.

Still another object is to homogenize a laser beam without creating any interference patterns.

It is also an object of this invention to provide an intense and bright ultraviolet light illumination source which is spatially uniform in intensity.

These and further objects have been achieved by the present invention in which a coherent laser beam having a possibly non-uniform spatial intensity distribution is transformed into an incoherent light beam having a substantially uniform spatial intensity distribution by homogenizing the laser beam with a light tunnel (a transparent light passageway having flat internally reflective side surfaces).

If the laser beam does not significantly diverge (i.e., increase in cross-section as it propagates), it is first focussed (or defocussed) to produce a diverging input laser beam. The diverging laser beam is then passed through a light tunnel, the reflective sides of the light tunnel forming an array of apparent laser light sources, the light from which is superposed by the light tunnel at the exit thereof. An array of apparent light sources will be formed by the reflective sides of the light tunnel only when the light tunnel has a sufficiently high aspect ratio (length divided by width), the minimum acceptable aspect ratio for the light tunnel being critically dependent upon the beam divergence angle of the input laser beam. The greater the beam divergence angle of the input beam, the lower the aspect ratio of the light tunnel may be.

Heretofore, it was generally believed that light interference effects which occur when coherent laser light is reflected and superposed upon itself by a light tunnel would inevitably result in an output beam which is spatially non-uniform in intensity.

It has been surprisingly found, however, that when a laser beam is passed through a light tunnel and the light tunnel not only has an aspect ratio which is large enough to create an array of apparent light sources superposed at the exit, but also has a width which is sufficiently large, the laser light at the exit of the light tunnel (or alternatively at any image plane with respect thereto) will have a substantially uniform intensity distribution and will be incoherent! This happens whenever the path lengths for the individual light rays from each of the apparent sources to each of the points at the illumination plane where intensity uniformity is desired are sufficiently different (i.e., equal to or greater than the effective coherence length of the light).

The minimum acceptable width for the light tunnel critically depends upon both the chosen aspect ratio for the light tunnel (the lower the aspect ratio, the lower the minimum acceptable width) and the coherence length of the laser light effectively seen by the light tunnel (the lower the effective coherence length, the lower the minimum acceptable width). While there is considerable freedom in choosing a suitably low aspect ratio for the tunnel, because the input beam divergence angle may be readily increased with a lens to accommodate a reasonably low aspect ratio tunnel, the actual coherence length of a laser beam is determined by the type of laser source and cannot readily be changed without changing the laser source. It has been found, however, that a suitably constructed and positioned retardation plate (and/or lens aberrations, to a limited extent) may be used to effectively reduce the coherence length of the laser light seen by a light tunnel (i.e., to reduce the effective coherence length of the laser beam). The retardation plate (and/or aberrated lenses) furthermore may be suitably positioned on either side of the tunnel (depending upon the optical system configuration) and still reduce the effective or equivalent coherence length of the laser light being homogenized by the light tunnel.

This dependence of the minimum acceptable aspect ratio upon the beam divergence angle of the input beam as well as the discovered simultaneous dependence of the minimum acceptable width for the light tunnel upon both the chosen aspect ratio of the light tunnel and the effective coherence length of the laser light may explain why heretofore all known prior attempts to use a light tunnel to homogenize a laser beam have been unsuccessful due to light interference effects. Apparently, either the aspect ratio or the width of the tunnel (or both) has always been too small, probably because either the effective coherence length of the chosen laser light has been too long or because the beam divergence angle of the input beam has been too small (or both)!

It has been determined that when the cross-section of the tunnel is a polygon (as preferred) and the sides of the tunnel are all parallel to the axis of the tunnel (as preferred), the minimum required aspect ratio $R_{min}$ for the light tunnel is equal to the cotangent of the input beam divergence angle $\theta$:

$$R_{min} = \cot \theta$$

where $\theta$ is the angle between the optical axis and the least divergent marginal ray of the input beam accepted by the tunnel.

The chosen aspect ratio R for the light tunnel (which is preferably 1.5 or 2.5 times $R_{min}$) along with the effective coherence length $L_{coh}$ of the laser light being homogenized determine the minimum width $W_{min}$ for the light tunnel in accordance with the following formula:

$$W_{min} = L_{coh}(R + (1 + R^2)^{\frac{1}{2}}) > 2RL_{coh}.$$

Rare gas halide excimer lasers emit ultraviolet laser light which already has a relatively short coherence length. Therefore, the light from an excimer laser can be easily transformed in accordance with this invention into bright ultraviolet illumination for use in microcircuit lithography. Lasers having a much longer coherence length require a light tunnel with more extreme geometry, which may not be practical in many cases, and/or the use of one or more retardation plates or lens aberrations to reduce the effective coherence length of the light seen by the light tunnel. Even with the use of one or more retardation plates and lens aberrations, the light tunnel geometry may still be too extreme to be practical for homogenizing laser light having a very long coherence length.

BRIEF DESCRIPTION OF THE DRAWINGS

FIG. 2 shows the array of 9 sources apparently formed by the embodiment of FIG. 1.

FIG. 3 is a cross-sectional view of the input beam for the FIG. 1 embodiment with the region corresponding to each of the 9 apparent sources being identified and labelled with a distinct letter.

FIG. 4 is a view of the exit face of the light tunnel with the distinct letter labels shown.

FIG. 14 illustrates the use of this invention as the light source for an application positioned at the light tunnel exit face.

FIG. 15 illustrates another use of this invention as the light source for a remote application where the uniform illumination is imaged onto a remote plane.

FIG. 16 shows the FIG. 15 embodiment where the exit face of the light tunnel is telecentrically imaged onto the remote plane.

FIG. 17 illustrates still another use of this invention as the light source for a projection printing application

DESCRIPTION OF THE PREFERRED EMBODIMENTS

Figure 1:
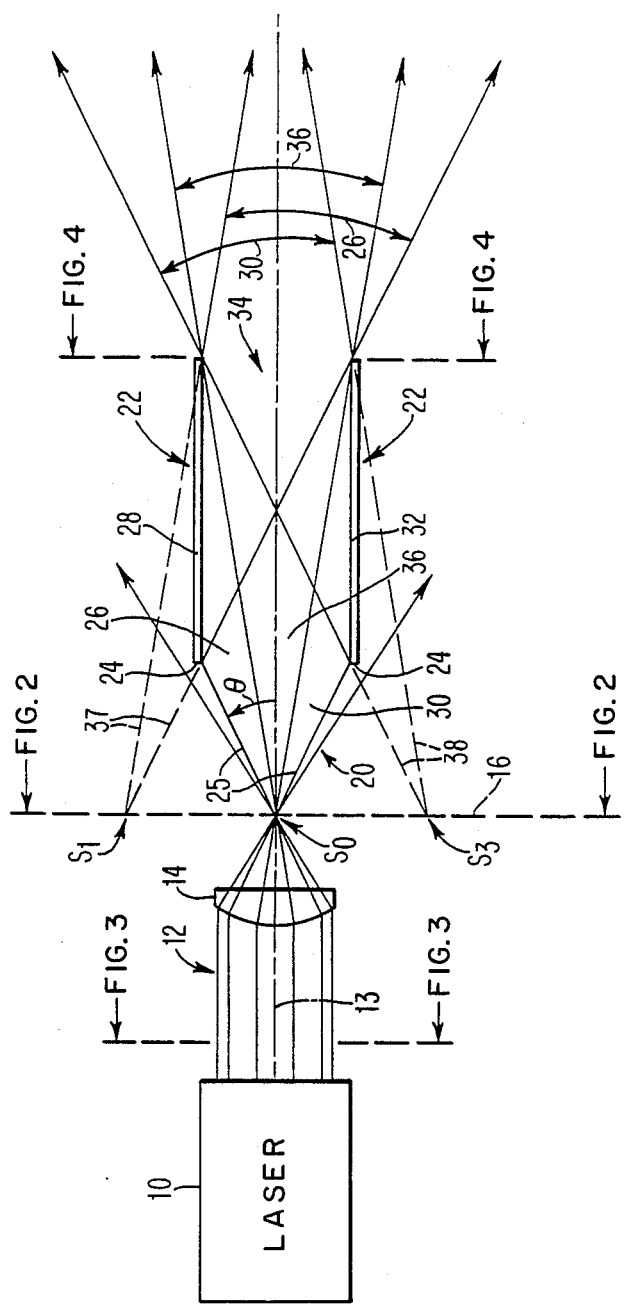
FIG. 1 is a schematic view of an illustrative embodiment of this invention in which the light tunnel geometry is such that exactly 9 apparent sources are completely formed.

FIG. 1 illustrates the principles of this invention. A typical laser 10 generates a beam 12 which diverges very little (i.e., the angle between the marginal rays in the beam and the axis of the beam is very small). For purpose of illustration, it will be assumed that the laser in FIG. 1 generates a round collimated laser beam 12 (beam divergence angle =0). In order for the light tunnel to have a reasonable geometry (i.e., dimensions), the input laser beam to the light tunnel should have a significant beam divergence angle (herein defined as the angle between the least divergent marginal ray in the light tunnel and the beam axis). Accordingly, lens 14 focuses the laser beam 12 onto focal point $S_0$, which defines a focal plane 16 perpendicular to the optical axis 18 of the laser beam and creates a diverging laser beam 20 with a significant beam divergence angle $\theta$. A defocussing lens could be used in place of the focussing lens, in which case a virtual focal point would be defined thereby in place of the real focal point. A square light tunnel 22 receives most of the diverging laser light 20.

For ease of understanding, the illustrated light tunnel has been positioned such that the entrance edges 24 form a square aperture which limits the entering light to a square cross-section and defines the marginal rays 25 of the light in the tunnel. If the light tunnel 22 instead were extended to plane 16, all of the light in beam 20 would have been received by the light tunnel so that the marginal rays in the light tunnel and the marginal (or outside peripheral) rays of the beam 20 would be the same. As described in further detail later, the length L of the tunnel is defined herein for convenience as a length extending all the way to the focal plane 16, even when the physical length of the tunnel is less, as shown in FIG. 1. This is done because a tunnel extending all the way to the focal plane is optically equivalent to a tunnel which extends forward toward the source even farther or one which does not extend even to the focal plane, so long as the marginal rays in the light tunnel are not changed thereby.

In FIG. 1, the light tunnel entrance acts as a square aperture stop, but this function can be accomplished very well instead by physically placing a square aperture stop between the lens 14 and the laser 10 to form an input laser beam having a square cross section. If the marginal rays are defined ahead of the tunnel (or if those rays outside of a predefined region are simply ignored), the tunnel can be extended farther back towards the lens 14 without causing any optical change at all. Because this is generally true, length measurements for a tunnel will always be considered herein to be measured to the focal plane 16.

The beam divergence angle $\theta$ is defined as the angle between the axis 18 and the least divergent marginal ray in the light tunnel. Actually, there is a least divergent marginal ray with respect to each of the reflective sides of the tunnel and the minimum geometric requirements for the tunnel need to be satisfied individually for each of the reflective sides of the tunnel. For convenience of illustration and ease of understanding, however, only symmetrical systems with light tunnels having parallel sides and polygonal cross-sections will be described in detail. Nevertheless, asymmetrical systems are also contemplated and will be briefly discussed later. With the illustrated square tunnel coaxial with axis 18, the least divergent marginal ray striking each reflective side of the tunnel strikes the inside front edge of each side at the midpoint of the reflective side, and the beam divergence angle is the same with respect to each of the sides. FIG. 1 is a cross-sectional view through the center of sides 28 and 32, thereby showing two of these least divergent marginal rays 25.

The illustrated light tunnel has a length and width such that the diverging laser light portion 26 reflected from the top side 28 and the diverging laser light portion 30 reflected from the bottom side 32 each exactly fills the exit face 34 of the light tunnel. Central portion 36 of the diverging laser light passes through the tunnel without any reflection, while the peripheral portions 26 and 30 are reflected.

Since the rays in each of the reflected portions of the light are still diverging after reflection, the reflected rays may be extended backwards, as shown by the broken lines 37 and 38, to define virtual focal points or virtual light sources $S_1$ and $S_3$ respectively. Actually, two more virtual focal points or sources $S_2$ and $S_4$ are formed by the light which is reflected once from the left and right sides (not shown) of the light tunnel and four additional virtual focal points or sources $S_5$ through $S_8$ are formed by light which makes a reflection from each of two adjacent sides at each of the four corners of the tunnel.

FIG. 2 is a plan view of the focal plane 16 showing the array of apparent light sources (i.e., real light source $S_0$ and virtual light sources $S_1$ through $S_8$) produced by the light tunnel of FIG. 1. FIG. 3 is a cross-sectional view of the collimated laser beam 12 identifying the separate regions of the laser beam 12 which correspond to each of the nine apparent sources identified in FIG. 2. In FIG. 3, the square cross-sectional area of the beam which forms each of the sources is labelled with the same label as the corresponding apparent source is labelled in FIG. 2. The portions 40 of the collimated laser beam 12 which are outside the regions corresponding to the apparent sources $S_0$ through $S_8$ do not get through the square limiting aperture defined by the square input face of the tunnel.

All nine apparent sources $S_0$–$S_8$ illuminate and completely fill the exit face 34 of the light tunnel. Another way of viewing this is that all nine of the separate portions $S_0$–$S_8$ of the collimated beam become superposed at the exit face 34 of the light tunnel. The separate portions are in effect folded over common edges until all are superposed over the central portion. In FIG. 3, a spot in each of the nine portions of the collimated beam has been additionally labelled with a distinct letter symbol A through I. In FIG. 4, the output face of the tunnel is illustrated with the same letter symbols shown in corresponding position, orientation and size. Homogenization of the laser beam occurs as a result of this partitioning of the input light beam into a plurality of parts (each corresponding to one of the apparent light sources in the array) and superposition of the parts at the exit face of the light tunnel.

Figure 5:
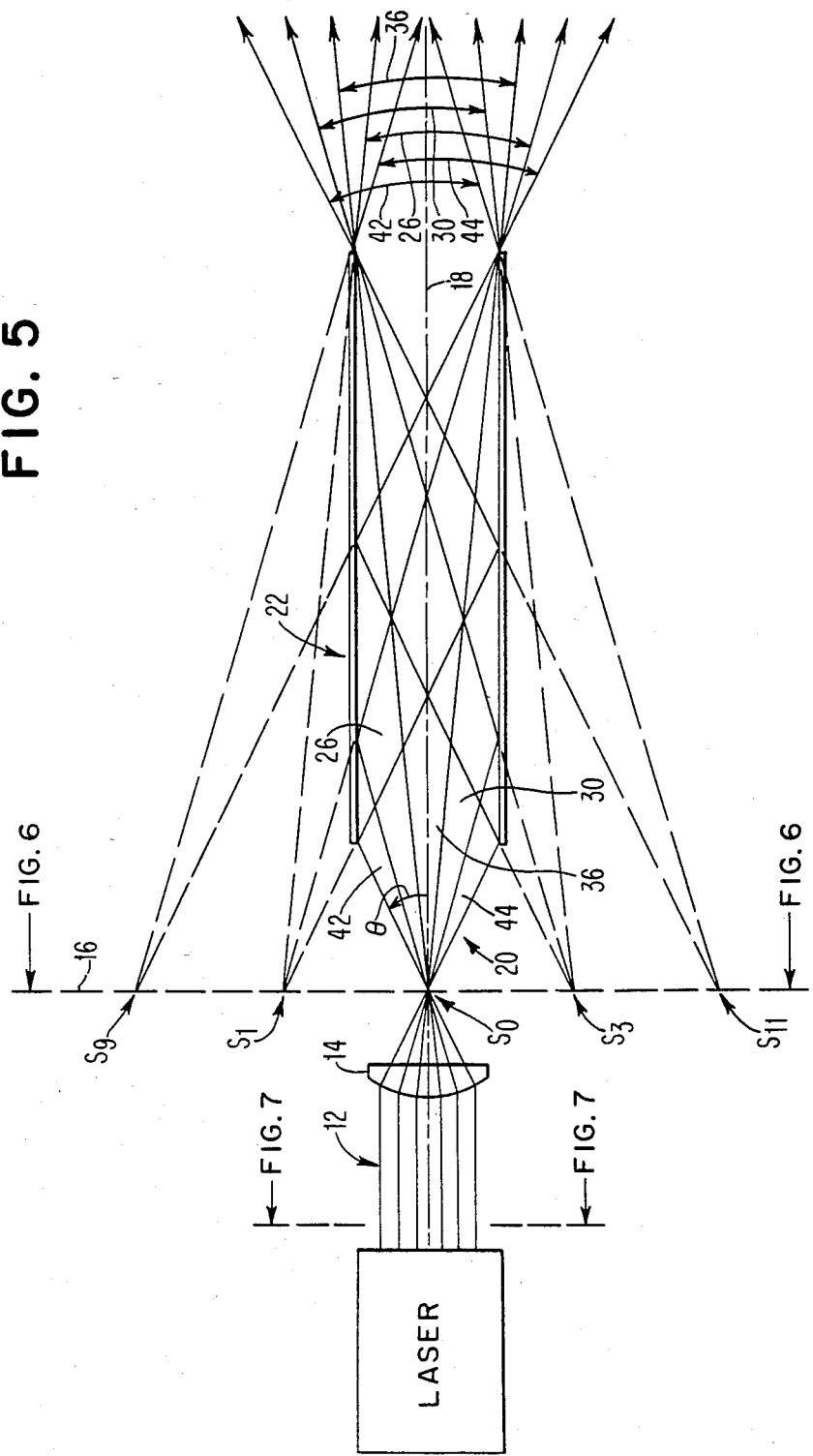
FIG. 5 is a schematic view of the same embodiment shown in FIG. 1 except that the length of the light tunnel has been doubled so that exactly 25 apparent sources are completely formed.
Figure 6:
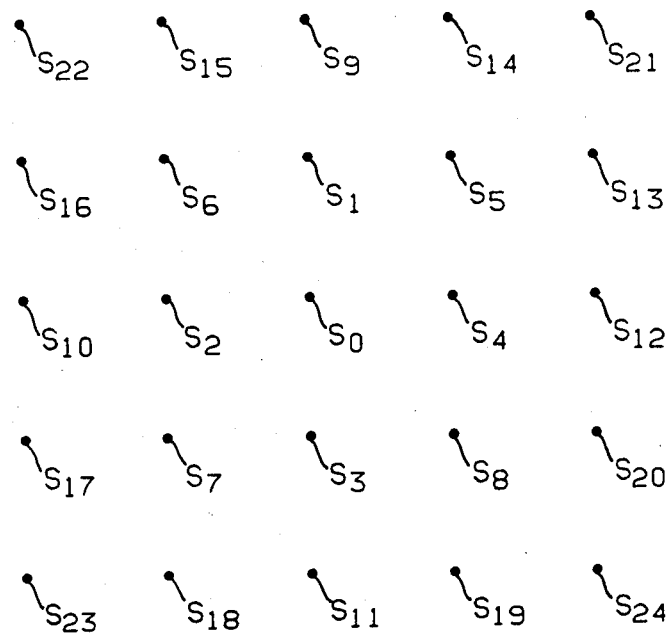
FIG. 6 shows the array of 25 sources apparently formed by the FIG. 5 embodiment.
Figure 7:
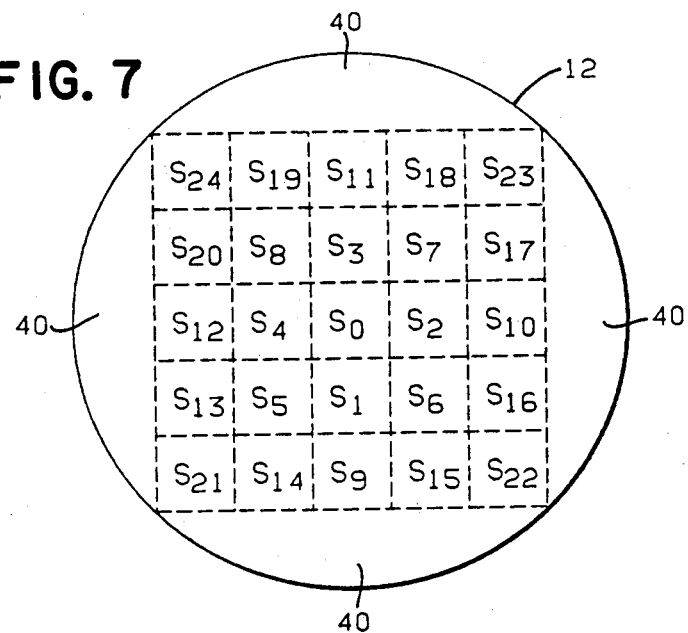
FIG. 7 shows a cross-sectional view of the input beam for the FIG. 5 embodiment with the region corresponding to each of the 25 apparent sources being identified.

FIG. 5 illustrates what happens when the light tunnel in FIG. 1 is increased in length (as measured to focal plane 16) by two-thirds (i.e., 5/3 times the length of the FIG. 1 tunnel). In addition to the central portion 36, which passes through the tunnel without any reflection, and an upper portion 26 and lower portion 30, which pass through with one reflection, there is an additional upper portion 42 and lower portion 44, which pass through the tunnel with a reflection from both the top and bottom sides. These additional doubly reflected portions define additional focal points or apparent sources $S_9$ and $S_{11}$. Actually, sixteen additional virtual (or apparent) sources are formed as a result of additional reflections. FIG. 6 is a plan view of the focal plane 16 in FIG. 5 showing the full array of 25 apparent sources formed by the light tunnel in FIG. 5. FIG. 7 is a cross-sectional view of the collimated laser beam 12 identifying the separate regions of the laser beam which correspond to each of the apparent sources shown in FIG. 6.

It should be apparent from comparing FIG. 1 with FIG. 5 that the length of a light tunnel in these embodiments did not affect the beam divergence angle of the output light. Since the input beam divergence angle is the same in both FIG. 1 and FIG. 5, the output beam divergence angle of both is also the same. The input and output beam divergence angles are equal to each other in both cases because the light tunnels are parallel light tunnels (i.e., the sides of the light tunnels are all parallel to the common axis 18). If a diverging or converging light tunnel were used instead, the output beam divergence angle would be less or more respectively than the input beam divergence angle. Although this invention contemplates the possibility that a diverging o converging light tunnel could be used instead of a parallel light tunnel, it is not apparent that any practical advantage can stem from deliberately using a diverging or converging light tunnel. It would seem that any conversion of N.A. that the non-parallel tunnel might perform could be more easily implemented by the lens or lenses in the system.

The light tunnels in FIGS. 1 and 5 both have a square cross-section. Other configurations are also contemplated. A light tunnel with three reflective sides could be used in place of any of the four sided tunnels illustrated, which would obviously change the array of apparent sources formed thereby. Any larger number of reflective sides could also be used instead, such as a six or eight sided light tunnel. Although cross-sections which are regular polygons (i.e., all sides of the polygon and all of the included angles are equal to each other) are preferred, other cross-sections are also possible so long as each reflective side individually satisfies the corresponding minimum geometric conditions (i.e., minimum aspect ratio and width).

The light tunnels are illustrated as hollow structures with reflective interior flat surfaces. Alternatively it is possible to form a light tunnel from a solid transparent material with possibly a coating being applied on the outside of the flat sides, if needed, to make them internally reflective.

It should be apparent that the beam divergence angle of the light entering the tunnel along with the aspect ratio (length divided by width) of the tunnel determines how many bounces the marginal rays will make before they exit the tunnel. The number of bounces of the marginal rays along with the number of tunnel sides determines the number and configuration of the apparent sources. Ideally the geometry should be arranged so that each of the apparent sources are formed with light that completely fills the exit of the tunnel. As illustrated in FIG. 4 however, the subdivided laser light parts are effectively folded over each other, so that partial apparent sources (those which do not completely fill the exit of the tunnel, corresponding to input beam portions which are only partly filled with light or which are only partly received by the tunnel input aperture) tend to compensate for each other and thus are acceptable.

Figure 8:
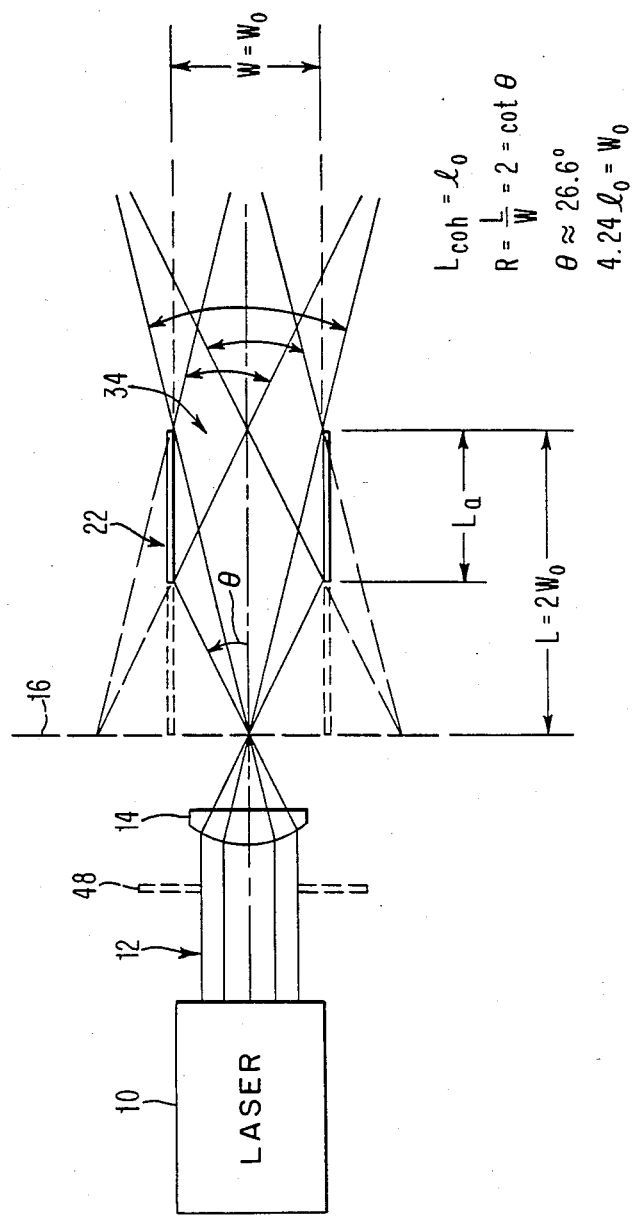
FIG. 8 is a schematic view of the minimum acceptable geometry for a light tunnel with parallel sides and a square cross-section when the input beam divergence angle is about 26.6 degrees and the effective coherence length of the light is $l_o$.

FIG. 8 illustrates a light tunnel configuration where the tunnel aspect ratio $R = L/W$ is as small as possible for a particular beam divergence angle $\theta$. In order to assure that intensity uniformity is achieved, it has been determined that with respect to each reflective side, the marginal ray which is directly reflected (i.e. with only one reflection) through the central axis of the light tunnel must pass through this axis within the light tunnel. The minimum acceptable geometry is where the marginal ray which passes through the tunnel axis with only one reflection at a point furthermost along the tunnel axis does so at the exit of the tunnel. In a symmetrical system, each of the marginal rays which pass through the tunnel axis after only one reflection will pass through this axis at the same common point. The minimum aspect ratio for a symmetrical system thus is where this common point is at the exit of the tunnel. This configuration is shown in FIG. 8.

At the minimum aspect ratio the first order virtual source formed by each reflective surface is only partly formed and only partly fills the exit face of the tunnel. This is acceptable only because each of the reflective sides partly fills different portions of the exit face, which thereby tends to average away intensity variations. The minimum aspect ratio is illustrated in FIG. 8. A more preferred aspect ratio, however, is about 50 percent larger (corresponding with a square cross section to 9 substantially completely formed apparent sources) or about 150 percent larger (corresponding with a square cross section to 25 substantially completely formed apparent sources).

The aspect ratio R of the light tunnel is defined as the equivalent length L of the tunnel divided by the equivalent width W of the tunnel, where the equivalent length L is defined as the distance along the optical axis between the focal point of the diverging input beam and the light tunnel exit 34 and the equivalent width W is defined as twice the minimum distance between the pertinent reflective side of the tunnel (any reflective side, when the system is symetrical) and the central axis thereof. When the light tunnel has an invariant cross-section which is a regular polygon with an even number of sides, this equivalent width W is the distance between any two opposing reflective sides of the tunnel. At the minimum aspect ratio $R_{min}$, at least one (and in the case of a symmetrical system all) of the least divergent marginal rays reaches the optical axis at the exit face (as illustrated in FIG. 8). The minimum aspect ratio $R_{min}$ (see FIG. 8) thus is equal to the cotangent of the beam divergence angle $\theta$:

$$R_{min} = \cot \theta \qquad \text{Equation 1,}$$

where $\theta$ is the angle between the optical axis and the least divergent marginal ray reflected by the pertinent side of the tunnel (any side in the case of a symmetrical system). Conversely, the minimum beam divergence angle $\theta_{min}$ is equal to the arccotangent of the selected aspect ratio R:

$$\theta_{min} = \text{arc cot } R \qquad \text{Equation 2.}$$

So long as the marginal ray directly reflected across the tunnel axis at the furthermost position along the tunnel axis is not changed thereby, any material length added to or taken away from the tunnel at the entrance face makes no significant difference at all. In FIG. 8, this is illustrated by the phantom portion 46 of the light tunnel, any portion or all of which may be added or removed effect. Although the length L of the tunnel is defined as the distance along the optical axis from the tunnel exit to the focal plane 16, the actual length of the physical material of the tunnel $L_a$ may be shorter (i.e., it need not actually extend to the focal plane) since some portion 46 always is not actually needed to receive and reflect any light. As further shown in FIG. 8, it is possible to define the marginal rays with an aperture 48.

Even when the aspect ratio and beam divergence angle are sufficient to form an array of apparent sources which are superposed at the tunnel exit, a minimum width $W_{min}$ is still required to assure that interference effects are not encountered. The minimum required width $W_{min}$ is a function of both the chosen aspect ratio R and the effective coherence length $L_{coh}$ of the laser light being homogenized by the light tunnel. More specifically, the actual width W must be equal to or greater than the effective coherence length of the laser light being homogenized $L_{coh}$ times the sum of the chosen aspect ratio and the square root of the quantity 1 plus the chosen aspect ratio squared, or:

$$W_{min} = L_{coh}(R + (1 + R^2)^{\frac{1}{2}}) \qquad \text{Equation 3.}$$

The following Table correlates various values for the aspect ratio R with the minimum beam divergence angle $\theta_{min}$ required for that aspect ratio, as defined in Equation 2, and the minimum width $W_{min}$ required in terms of the effective coherence length $L_{coh}$, as defined in Equation 3

TABLE

| R | $W_{min}$ | $\theta_{min}$ (in degrees) |
|---|---|---|
| 1.0 | 2.41 $L_{coh}$ | 45.0 |
| 1.5 | 3.30 $L_{coh}$ | 33.7 |
| 2.0 | 4.24 $L_{coh}$ | 26.6 |
| 2.5 | 5.19 $L_{coh}$ | 21.0 |
| 3.0 | 6.16 $L_{coh}$ | 18.4 |
| 3.5 | 7.14 $L_{coh}$ | 15.9 |
| 4.0 | 8.12 $L_{coh}$ | 14.0 |
| 5.0 | 10.10 $L_{coh}$ | 11.3 |

TABLE-continued

| R | $W_{min}$ | $\theta_{min}$ (in degrees) |
|---|---|---|
| 6.0 | 12.08 $L_{coh}$ | 9.5 |
| 7.0 | 14.07 $L_{coh}$ | 8.1 |
| 8.0 | 16.06 $L_{coh}$ | 7.1 |
| 9.0 | 18.06 $L_{coh}$ | 6.3 |
| 10.0 | 20.05 $L_{coh}$ | 5.7 |

As shown by this Table, the minimum acceptable width for the tunnel (at reasonable values for the beam divergence angle $\theta$, which preferably is about 1.5 to 2.5 times $\theta_{min}$) is only slightly more than twice the aspect ratio times the effective coherence length of the light, thus:

$$W_{min} > 2RL_{coh} \qquad \text{Equation 4, and}$$

$$W_{min} \approx 2RL_{coh} \qquad \text{Equation 5.}$$

Thus for practical geometries, a convenient rule of thumb is that the width of the tunnel must be no less than twice the aspect ratio times the effective coherence length of the light being homogenized by the light tunnel. It should be obvious that a very high aspect ratio will result in a minimum acceptable width which is also very large unless the effective coherence length of the light being homogenized is very small. This virtually precludes the use of optical fiber type geometries unless the effective coherence length of the laser light is essentially zero.

Figure 9:
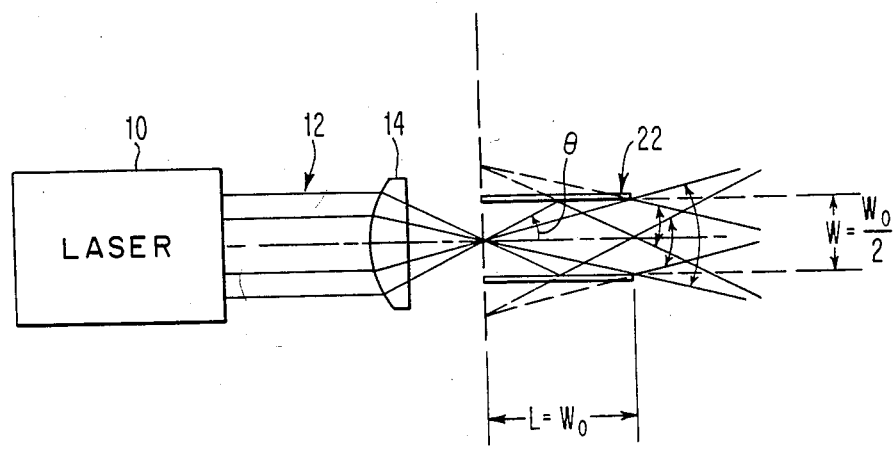
FIG. 9 is a schematic view of the same configuration shown in FIG. 8 except that the width and length of the tunnel are only half as large.

In FIG. 9, the tunnel length L in FIG. 8 has been reduced by one half without any change in the aspect ratio R (which is shown equal to 2), because the width W has been reduced by one half also. A comparison of FIGS. 8 and 9 will show that the aspect ratio $R = L/W$ of each is the same ($R = 2$). Thus, the light tunnels in FIGS. 8 and 9 both form an array of virtual sources which are similar (i.e., identical except for a scaling or magnification factor, which is two in this case). The virtual sources formed by the FIG. 8 tunnel are spaced from each other by twice as much as the spacing between the virtual sources formed by the FIG. 9 tunnel. If it is assumed, however, that the minimum width $W_{min}$ in accordance with Equation 3 is $W_o$ ($W_{min} = 4.2$-$41_o = W_o$, when $L_{coh} = l_o$ and $R = 2$ as in FIG. 8), then the tunnel configuration in FIG. 9 will not be sufficient to avoid intensity variations due to interferences, even though the aspect ratio is the same as in FIG. 8, because the width is too small. At an intuitive level, this happens because the virtual sources have been moved closer together.

Figure 10:
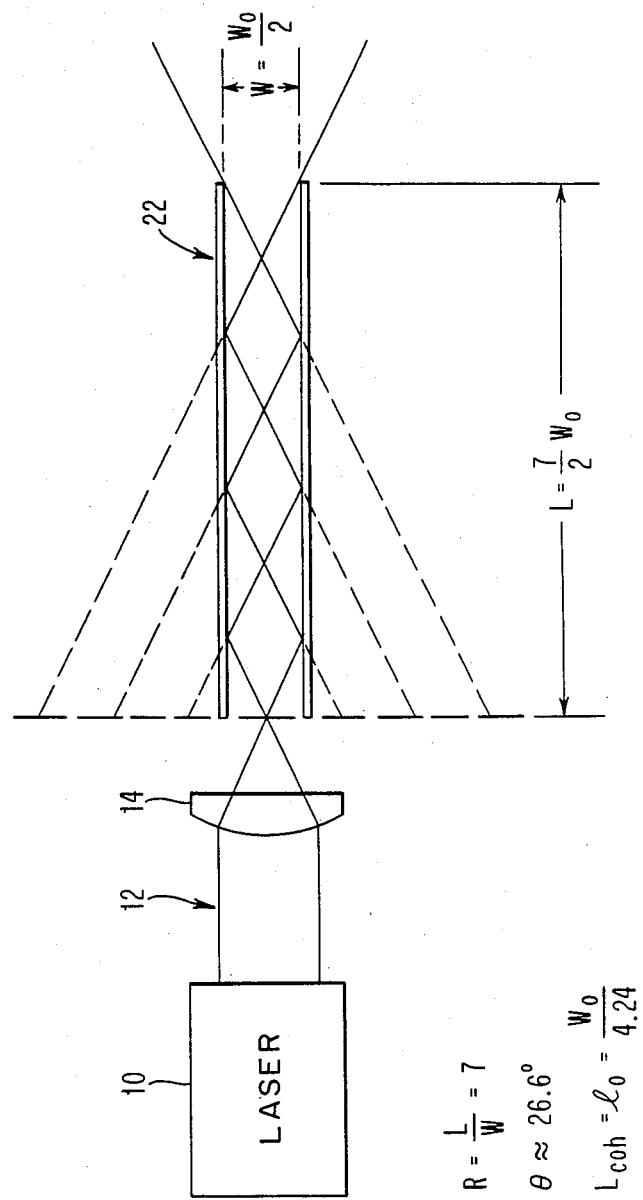
FIG. 10 is a schematic view of the same configuration shown in FIG. 9 except that the tunnel is three and a half times longer than in FIG. 9.

In FIG. 10, the tunnel length of the FIG. 9 tunnel has been increased by 250 percent to a length 75 percent larger than the length of the FIG. 8 tunnel (i.e., $L = 3.5W_o$) without changing the width $W = W_o/2$. As a result, the aspect ratio has been increased from 2 (FIGS. 8 & 9) to 7 (FIG. 10). The FIG. 10 tunnel therefore forms a larger number of virtual sources (i.e., an array of 49 fully formed virtual sources). If it is assumed, however, that the effective coherence length of the light has not changed, this geometry also is not sufficient to avoid optical interferences even though the length of the tunnel is much larger than in FIG. 8. In fact, the FIG. 10 configuration is even worse from an interference viewpoint than the FIG. 9 configuration because the aspect ratio in FIG. 10 is much larger, which results in a much larger minimum acceptable width $W_{min}$ (see Equations 3-5). In order to still avoid optical interferences when the aspect ratio is increased from 2 to 7 (without any change in $L_{coh}$) requires that the width also be increased approximately by the same ratio (i.e., by a factor of about 3.5). This means that in order to increase the aspect ratio of the FIG. 8 tunnel (which was assumed to have the minimum aspect ratio and width), the actual equivalent length of the tunnel must be increased by about the square of this change in the aspect ratio to more than 10 times the length in FIG. 8.

Figure 11:
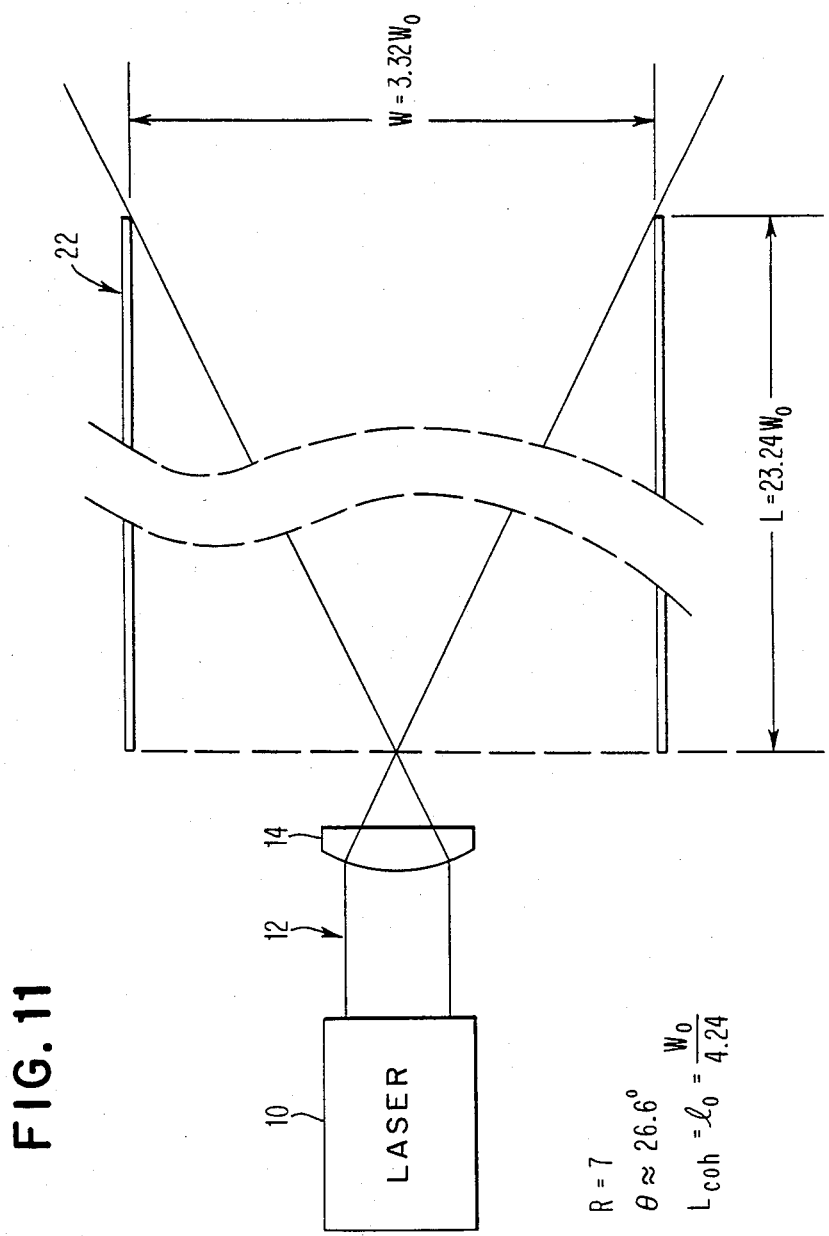
FIG. 11 is a schematic view of the minimum acceptable geometry for a light tunnel with parallel sides and a square cross-section when the input beam divergence angle is about 26.6 degrees, the effective coherence length of the light is $l_o$ and the chosen aspect ratio is 7.

In FIG. 11, the smallest tunnel is illustrated which has an aspect ratio of 7 and produces illumination with no significant intensity variation (to the same scale as shown in FIG. 8) when the effective coherence length $L_{coh}$ is the same as in FIG. 8. The length of the tunnel is so great that a portion has been removed from the center for convenience in illustrating this tunnel. It should be apparent that the minimum geometry of the tunnel (both width and length) increases very rapidly as the aspect ratio and the resulting number of apparent sources is increased.

Each ray from each of the apparent sources being formed travels a distinct path to the plane where intensity uniformity is desired (hereinafter called the illumination plane). Each of these individual paths has a path length and the individual path lengths vary. At each point in the illumination plane, rays from different apparent sources become superposed. In order to avoid an interference effect at any particular point in the illumination plane, it is necessary that each of the rays being superposed at that point (one ray coming from each apparent source, in general) travel a different path length and these path lengths must be different from one another by at least the effective coherence length of the light. In order to avoid interference effects over the whole illumination plane this condition must be met simultaneously at each point in the illumination plane! Equation 3 defines what is required in tunnel width as a function of aspect ratio and effective coherence length for this to be accomplished. The aspect ratio can be reduced only within reason, because as the aspect ratio decreases, the minimum required beam divergence angle increases, as shown in the Table and by Equation 2. The physical size of available optical elements thus limits the range of effective coherence lengths which can be handled by a practical light tunnel. It is estimated that probably the largest effective coherence length which is practical to work with if there are any output optical lenses is probably less than a tenth of a meter.

Fortunately, it is possible to effectively reduce the coherence length of the light being seen by the light tunnel so as to permit laser light sources to be homogenized with a light tunnel even when the laser source has a relatively large coherence length. This is possible because there are locations (at least one and often several) in the typical illumination system constructed in accordance with this invention where the light corresponding to each individual apparent source is physically separate and distinct from (i.e., substantially not overlapping in the physical space occupied) the light corresponding to the other apparent sources. At any of these locations, the path lengths for all of the light corresponding to a virtual source can be effectively changed with respect to the other apparent sources by inserting a different optical material at that location so that all of the light corresponding to that virtual source travels either faster or slower than otherwise while it goes through this different material, thus altering the effective path length for the light corresponding to that apparent source.

One location where such a retardation plate can be positioned is at the input before there is any mixing of the light bundles which ultimately form separate virtual sources. A very convenient position where this occurs in a system such as is shown in FIGS. 1 or 5 is anywhere between the lens 14 and the laser 10. A view of the cross-section of the laser beam at this position is shown in FIGS. 3 and 7 respectively. As shown in FIGS. 3 or 7, the square bundle of light corresponding to virtual source $S_o$ (or any other particular virtual source) is separate and distinct from the square light bundles corresponding to each of the other virtual sources. Furthermore, when the light beam is not diverging, such as at this location in the illustrations, the square bundle of rays corresponding to each virtual source has a substantially constant cross-section over a significant distance (i.e., over the whole distance from the laser to the lens).

Figure 12:
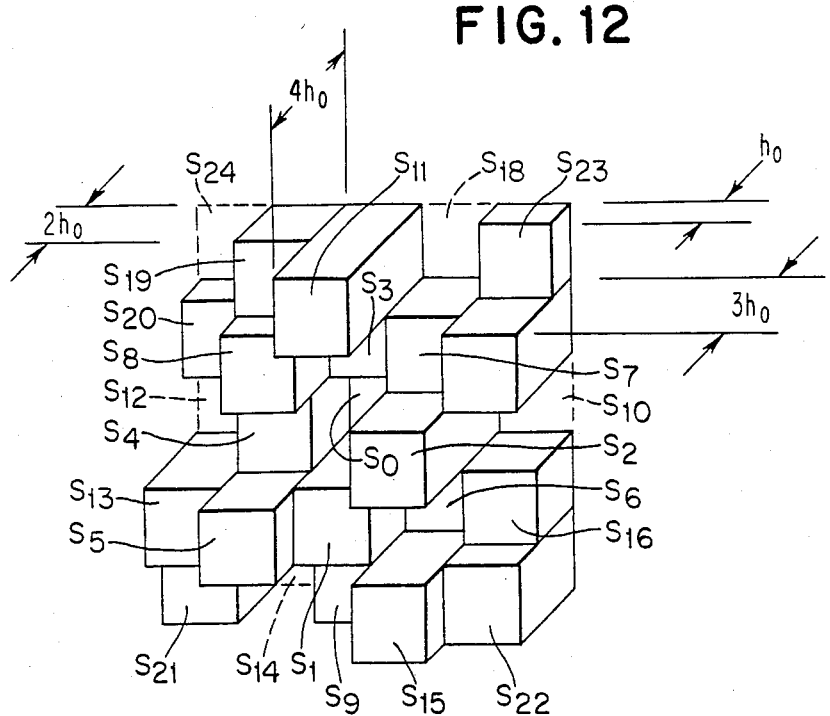
FIG. 12 is a perspective view of a retardation plate useful in reducing the effective coherence length of the light seen by a light tunnel when the chosen geometry creates a square array of 25 virtual sources as in the embodiment illustrated in FIGS. 5–7.
Figure 13:
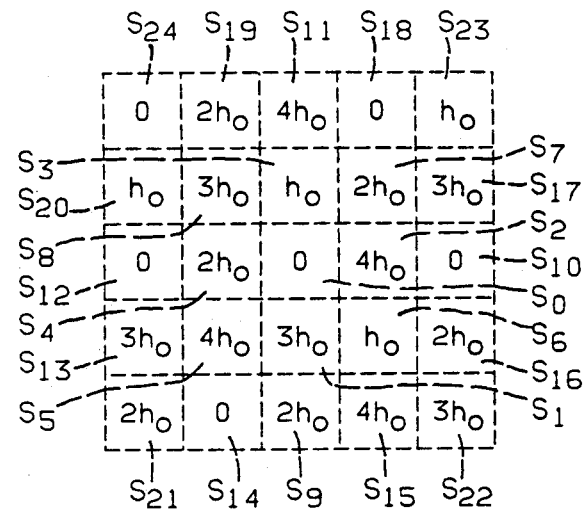
FIG. 13 schematically represents the retardation plate shown in FIG. 12 with the material heights identified in units of a step height $h_o$.

FIG. 12 illustrates a retardation plate which may be used to effectively reduce the coherence length when there are 25 apparent sources in a square array, such as is produced with a square cross-section tunnel of suitable aspect ratio as is illustrated in FIG. 5. The retardation plate has 25 square regions, each corresponding in size, orientation and position with a square light bundle that forms one virtual source. Each of the square regions is furthermore labelled with the virtual source label $S_o$ through $S_{24}$ to which it corresponds in FIGS. 5, 6 and 7. The retardation plate is sized, oriented and positioned between the lens 14 and laser 10 such that the light bundle corresponding to each of the virtual sources illustrated in FIG. 7 passes through a corresponding square region in FIG. 12. Each of the 25 square regions in the retardation plate has a height or thickness h which is different from all of its neighbors by an amount no less than $h_o$. This can be done when there are 25 square regions by using heights of zero, $h_o$, $2h_o$, $3h_o$, and $4h_o$ as shown by example in FIG. 12. The thicknesses (in units of $h_o$) of the 25 regions in the plate (labelled $S_o$ through $S_{24}$) are also shown in FIG. 13. Each of these regions changes the path length for the light of the corresponding virtual source (which passes through that region) by an amount proportional to the thickness h. Only adjacent virtual sources need to be considered because the path length difference between those virtual sources which are even farther apart already have an even greater path length difference.

The amount of path length change introduced by the material in the retardation plate depends upon the refractive index n of the material of the plate. In order to reduce the actual coherence length $L_o$ of the light by an amount $\Delta$ requires that the step size $h_o$ in the retardation plate be $\Delta/(n-1)$. It is possible in some situations to actually reduce the coherence length seen by the light tunnel to zero. A retardation plate with a step height $h_o$ which is equal to the actual coherence length $L_o$ of the laser light divided by n−1 would accomplish this. For a very large actual coherence length $L_o$, however, this is not practical because the step height would become so great that even if the geometry were not impractical, the optical loss sustained by inserting such a thick retardation plate would be unacceptable. Since the path lengths for a virtual source are changed with respect to another virtual source whenever there is a difference in propagation distance for each through a particular material, some variation in path length is introduced also by optical lenses and can be exploited to some limited extent to reduce the effective coherence length of the light seen by the light tunnel.

FIG. 14 illustrates one lithography configuration in which this invention may be used. In this configuration, the illuminated plane 50 where intensity uniformity is desired corresponds approximately with the exit face of the tunnel itself. A pattern mask 52 in the illumination plane 50 is in contact with or in the proximity of a wafer 54 coated with a light sensitive layer (not shown).

Another lithography configuration in which this invention may be used is shown in FIG. 15. In this configuration the plane 50 to be uniformly illuminated has been moved away from the exit face of the tunnel by a lens 56. A pupil 58 optionally may be used. Again a pattern mask 52 in the illumination plane 50 is in contact with or in the proximity of a wafer 54 coated with a light sensitive layer (not shown).

FIG. 16 illustrates still another configuration, which is the same as the FIG. 15 configuration except that an additional lens 60 has been added to make the illumination incident upon the mask 52 at a more uniform angle.

FIG. 17 shows a projection lithography system in which the present invention is being used. In this configuration, the wafer 54 has been moved away from the mask 52. Lens 62 images the mask 52 upon wafer 54. A pupil 64 is also schematically shown. The plane 50 at which uniform illumination is desired again is at the mask plane.

While a retardation plate may be positioned in front of the tunnel in each of the configurations shown in FIGS. 14 through 17 (i.e, in front of lens 14 or behind it with suitable changes in the geometry of the retardation plate), it is also possible to position a retardation plate at any other position in the optical system where the virtual sources are suitably separate and distinct in position from one another. This occurs at any plane where the virtual sources are imaged. In FIGS. 15, 16 and 17, the virtual sources are imaged at the pupil 58 and in FIG. 17 also at the pupil 64. In fact, pupils typically are also deliberately positioned in planes where the sources (or apparent sources in this case) are imaged. If both cannot be positioned at the same plane, either the pupil or the retardation plate can be moved away a little without seriously affecting the results.

Many modifications and variations of our invention will be apparent to those of ordinary skill in this field and may be made without departing from the spirit and scope of our invention as defined by the following claims. For example, the input beam and/or the light tunnel may be asymmetric. In a symmetrical system, the angle between the tunnel axis and the least divergent marginal ray striking each of the reflective sides is the same for each of the sides. When the input beam is asymetrical or the accepted portion of the beam is asymmetrical, the beam divergence angle seen by each reflective side of the tunnel might be different. As would be apparent to those skilled in this art, the beam divergence angle seen by each individual reflective side determines what the minimum aspect ratio must be with respect to that individual side. It would furthermore be apparent that if the sides of the tunnel have different aspect ratios, the effective minimum width required for each of the sides (i.e., twice the minimum distance between that side and the tunnel axis) will also vary. It is possible for asymmetry in the input beam divergence angle to be compensated for by an asymmetry in the tunnel cross-section, even possibly to the point where the effective aspect ratio of all sides could be equal even in an asymmetric system. When the various sides in an asymmetric system require different minimum widths, it is obviously possible to simultaneously satisfy all of the minimum width conditions by scaling the tunnel geometry up until the minimum effective width with respect to all sides is satisfied.

Having thus described our invention, what we claim as new and desire to secure by Letters Patent is:

1. Apparatus for uniformly illuminating a substantially flat plane with light from a coherent laser source, comprising
    means forming a diverging laser light beam which diverges from a central optical axis, the light in said beam having a coherence length $L_c$ an having possibly a non-uniform spatial intensity distribution;
    a light tunnel receiving said diverging laser beam, said light tunnel having flat internally reflective sides parallel to said optical axis and to each other to provide a light tunnel with a uniform size cross section for forming an array of apparent laser light sources, the light from each apparent source in said array being superposed by said light tunnel at the exit of said light tunnel, each individual light ray from each apparent source following a distinct light path to an illumination plane, each of said distinct light paths having an individual path length; and
    means providing a minimum difference between the individual path lengths of any two rays coincident at said illumination plane and arising from adjacent apparent sources in said array, said minimum path length difference being equal to or greater than the coherence length $L_c$ of said laser beam.

2. Apparatus as defined in claim 1 wherein said minimum path length difference providing means comprises a minimum width for said light tunnel equal to $L_{coh} \cos\theta(1-\cos\theta)$, where $\theta$ is the beam angle of said diverging laser beam and $L_{coh}$ is the effective coherence length of the light in said beam.

3. Apparatus as defined in claim 1 wherein said minimum path length difference providing means comprises a retardation plate positioned at a plane where the light rays corresponding to each distinct apparent source are spatially distinct from each other, distinct spatial regions of said plate corresponding uniquely with each separate apparent source, said distinct spatial regions of said plate providing different amounts of retardation for the rays of each adjacent apparent light source.

4. Apparatus as defined in claim 1 wherein said light tunnel has an aspect ratio R equal to or exceeding $\cot \theta$, where $\theta$ is the beam angle of said diverging laser beam and R is the distance between the focal point defined by said diverging laser beam and the exit of said light tunnel divided by the width of said light tunnel.

5. Apparatus as defined in claim 1 wherein said laser source is an excimer laser having a coherence length of less than 10 centimeters.

6. Apparatus as defined in claim 1 wherein said light tunnel has an even number of at least four flat reflective parallel sides.

7. Apparatus for uniformly illuminating a plane with light from a coherent laser source, comprising:
    means forming a diverging laser light beam, said diverging light beam defining a focal point, a focal plane and a beam axis, the light in said beam having an effective coherence length $L_{coh}$ and having possibly a non-uniform spatial intensity distribution;
    a light tunnel having at least four substantially flat internally reflective sides all approximately parallel with said beam axis to provide a uniform size tunnel cross section, said light tunnel having an entrance receiving at least a portion of said diverging laser beam and having an exit, said portion of said light beam received by said tunnel having a beam diverge angle;
    the distance L between said tunnel exit and said focal point divided by the minimum transverse dimension W of said light tunnel defining an aspect ration R, said aspect ratio R being no less than tahe cotangent of said beam divergence angle; and
    said minimum transverse dimension W of said light tunnel being no less than twice said aspect ratio R times said effective coherence length $L_{coh}$.

8. Apparatus as defined in claim 16 wherein said minimum transverse dimension W is no less than the effective coherence length $L_{coh}$ times the sum of the aspect ratio R and the square root of the quantity 1 plus the aspect ratio R squared.

* * * * *

UNITED STATES PATENT AND TRADEMARK OFFICE
CERTIFICATE OF CORRECTION

PATENT NO. : 4,744,615

DATED : May 17, 1988

INVENTOR(S) : B. Fan, R.E. Tibbetts, J.S. Wilczynski and D.F. Witman

It is certified that error appears in the above-identified patent and that said Letters Patent is hereby corrected as shown below:

Column 13, line 37  "$\cos\theta(1-\cos\theta)$"  should read --$\cos\theta/(1-\cos\theta)$--.

Signed and Sealed this

Fourteenth Day of February, 1989

*Attest:*

DONALD J. QUIGG

*Attesting Officer*      *Commissioner of Patents and Trademarks*